United States Patent
Chien et al.

(10) Patent No.: US 11,805,617 B2
(45) Date of Patent: Oct. 31, 2023

(54) CARRIER FOR STORAGE DEVICE

(71) Applicant: LITE-ON TECHNOLOGY CORPORATION, Taipei (TW)

(72) Inventors: Cheng-Hsuen Chien, Taipei (TW); Yi-Feng Pu, Taipei (TW); Chen-Yuan Liu, Taipei (TW); Pei-Hsuan Huang, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 17/726,333

(22) Filed: Apr. 21, 2022

(65) Prior Publication Data
US 2022/0346263 A1   Oct. 27, 2022

(30) Foreign Application Priority Data

Apr. 21, 2021   (CN) .......................... 202120822164.8

(51) Int. Cl.
*H05K 7/14* (2006.01)
*H05K 9/00* (2006.01)

(52) U.S. Cl.
CPC ......... *H05K 7/1487* (2013.01); *H05K 9/0007* (2013.01)

(58) Field of Classification Search
None
See application file for complete search history.

(56) References Cited

U.S. PATENT DOCUMENTS

| | | | | |
|---|---|---|---|---|
| 6,542,383 B1* | 4/2003 | Tsuyuki | ............... | H05K 9/0016 361/728 |
| 9,928,882 B1* | 3/2018 | Yang | .................... | G11B 33/124 |
| 10,228,734 B1* | 3/2019 | Hsieh | ..................... | G06F 1/187 |
| 2008/0043454 A1* | 2/2008 | Titus | .................... | H05K 7/1487 361/818 |
| 2008/0205026 A1* | 8/2008 | Gallarelli | ............... | G11B 33/12 361/818 |
| 2010/0149746 A1* | 6/2010 | Crippen | ............... | H05K 9/0062 361/679.33 |
| 2011/0141680 A1* | 6/2011 | Yang | .................... | G11B 33/124 361/679.31 |
| 2011/0304960 A1* | 12/2011 | Lu | ......................... | G06F 1/187 361/679.01 |
| 2014/0375187 A1* | 12/2014 | Li | ......................... | G06F 1/187 312/223.2 |
| 2021/0398567 A1* | 12/2021 | Lu | ....................... | G11B 33/124 |

FOREIGN PATENT DOCUMENTS

WO    WO-2017127048 A1 *   7/2017   ........... G11B 33/124

* cited by examiner

*Primary Examiner* — James Wu
*Assistant Examiner* — Christopher L Augustin
(74) *Attorney, Agent, or Firm* — Innovation Counsel LLP

(57) ABSTRACT

A carrier for a storage device is provided. The carrier includes an accommodation bracket, a panel and an electromagnetic shielding element. The accommodation bracket has an open space. The panel has a handle. The electromagnetic shielding element is disposed between the accommodation bracket and the panel. The electromagnetic shielding element is engaged with the accommodation bracket.

16 Claims, 10 Drawing Sheets

CARRIER FOR STORAGE DEVICE

This application claims the benefit of People's Republic of China application Serial No. 202120822164.8, filed Apr. 21, 2021, the disclosure of which is incorporated by reference herein in its entirety.

TECHNICAL FIELD

The present disclosure is related to a carrier, and is more particularly related to a carrier for a storage device.

BACKGROUND

A carrier, case and so on for a storage device may contain a component configured to accommodate a storage device and another component configured for protection against the electromagnetic interference, which are connected with each other and assembled mostly through additional connection parts (such as screws). This situation is unfavorable for automated manufacture operations, and the accompanying manufacture cost is higher.

SUMMARY

The present disclosure is directed to provide a carrier for a storage device adaptable to the automated assembly process.

In order to achieve the above purpose, the present disclosure provides an accommodation bracket, which comprises an accommodation bracket, a panel and an electromagnetic shielding element. The accommodation bracket has an open space. The panel has a handle. The electromagnetic shielding element is disposed between the accommodation bracket and the panel. The electromagnetic shielding element is engaged with the accommodation bracket.

Thus, the carrier for a storage device provided by the present disclosure is engaged with the electromagnetic shielding element, thereby achieving the fixation without using additional connecting components. As such, it is beneficial to the automated assembly process.

The above and other aspects of the disclosure will become better understood with regard to the following detailed description of the preferred but non-limiting embodiment(s). The following description is made with reference to the accompanying drawings.

Figure 1:
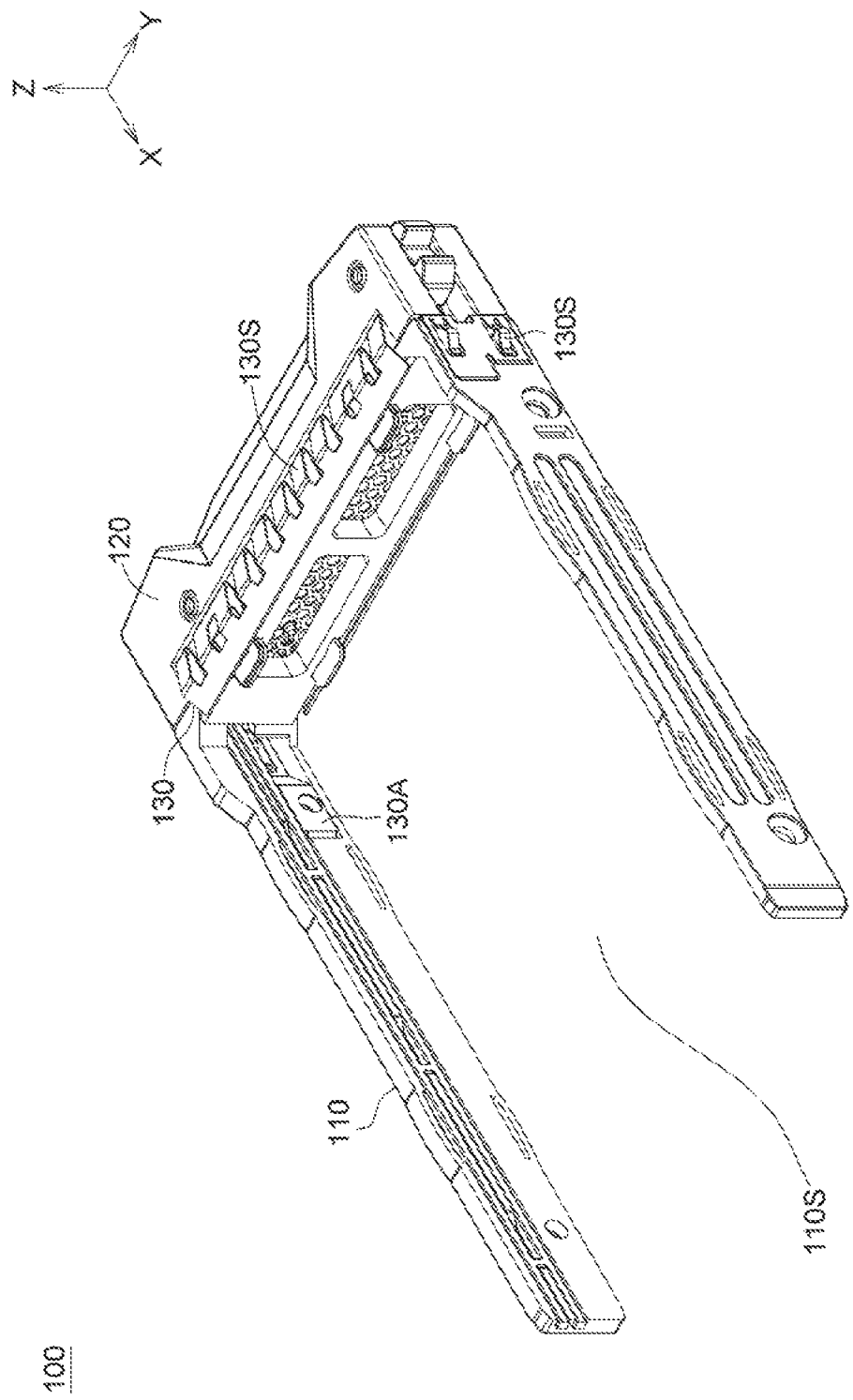
FIG. 1 is an assembly schematic diagram of a carrier for a storage device according to the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically indicated in order to simplify the drawing.

DETAILED DESCRIPTION

The technical content of the present disclosure is disclosed below in a number of embodiments with accompanying drawings, but not as a limitation to the present disclosure.

Figure 2:
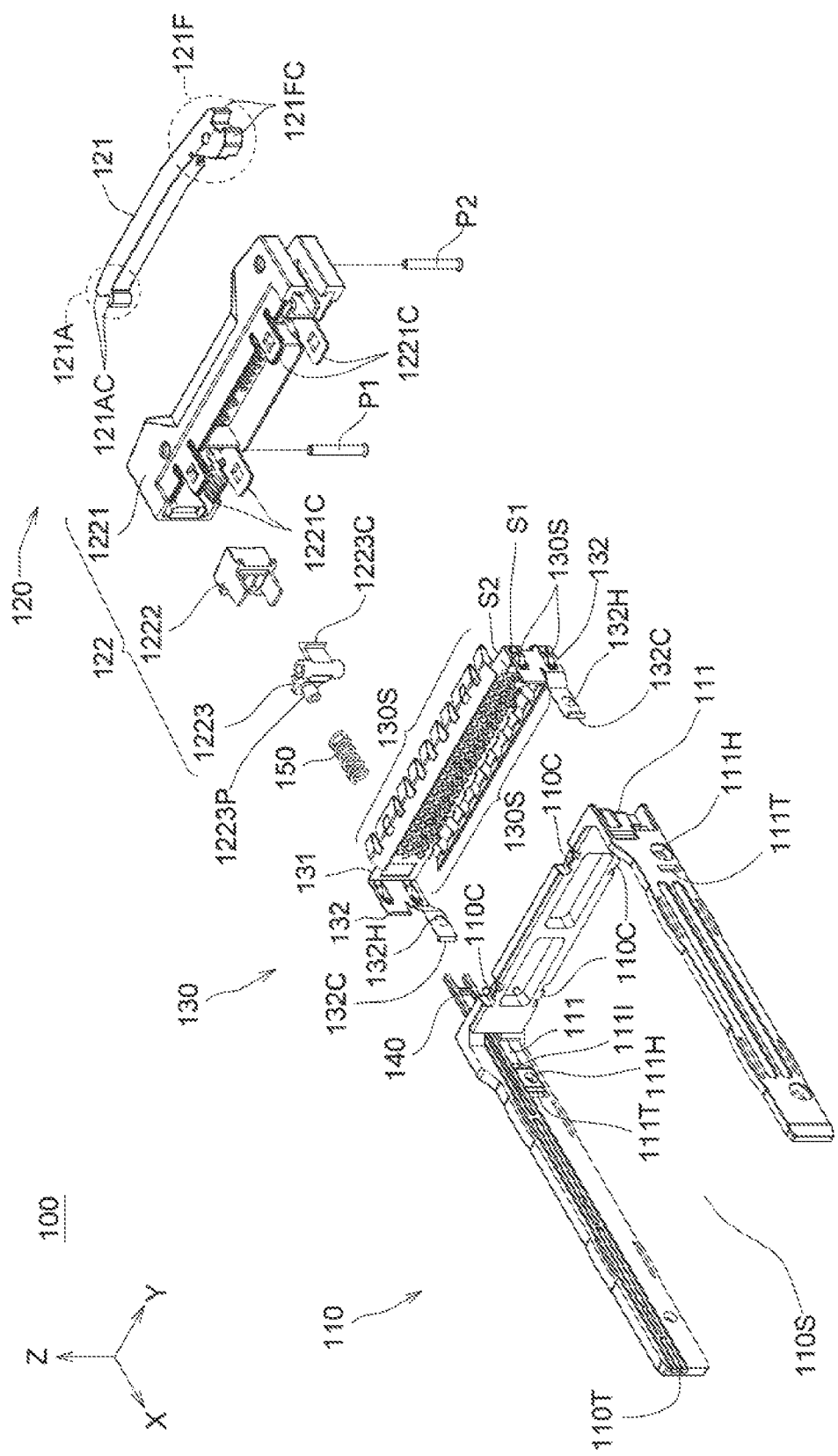
FIG. 2 is an exploded schematic diagram of the carrier for a storage device according to the first embodiment of the present disclosure.
Figure 3:
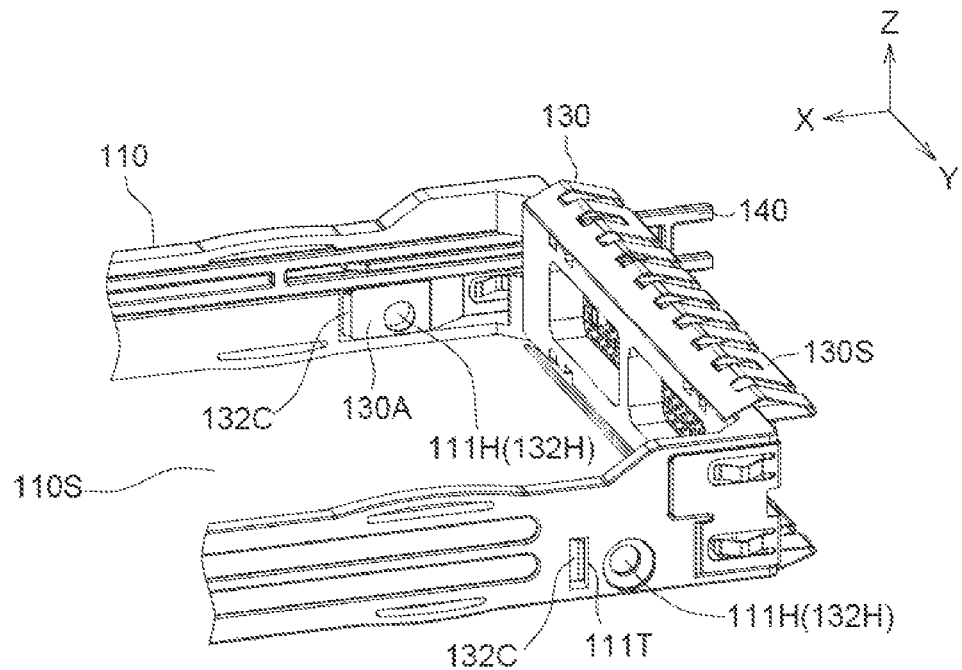
FIG. 3 is a combination diagram of some parts of the carrier for a storage device according to the first embodiment of the present disclosure.
Figure 4:
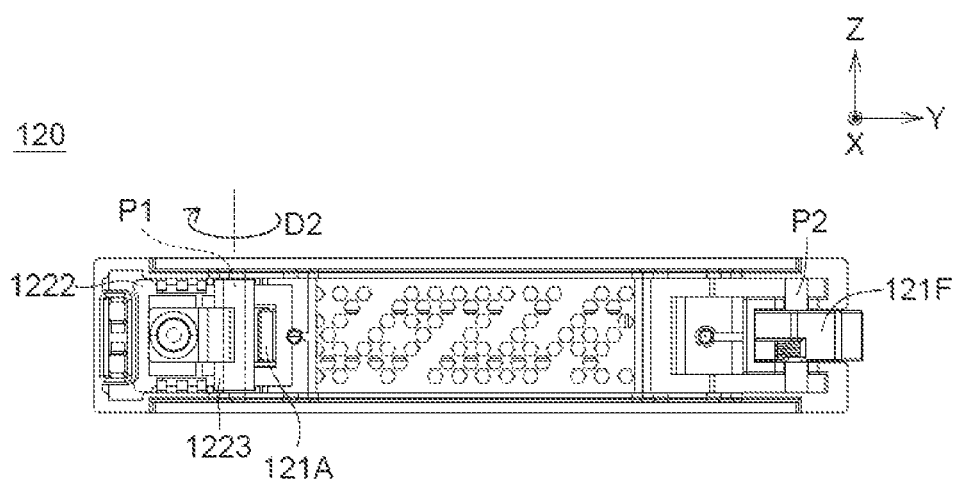
FIG. 4 is a front-view diagram of a part of the carrier for a storage device according to the first embodiment of the present disclosure.
Figure 5:
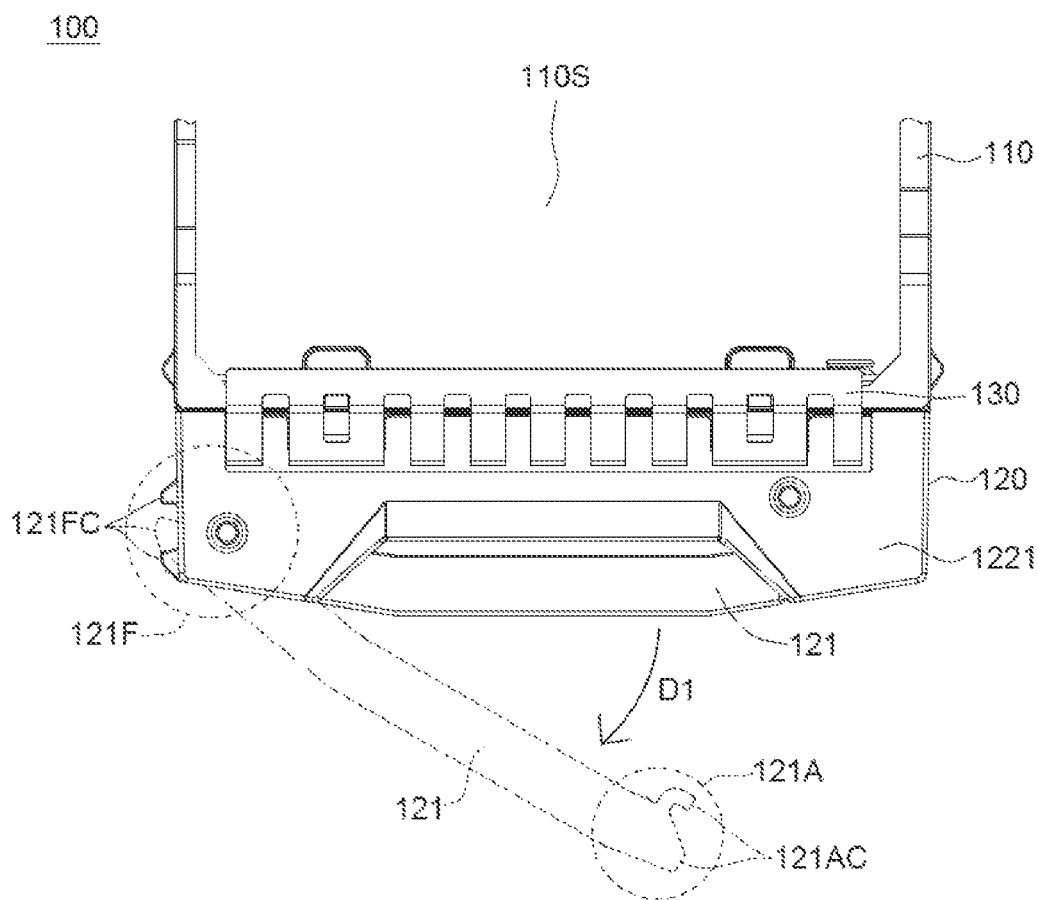
FIG. 5 is a partial top-view diagram of the carrier for a storage device according to the first embodiment of the present disclosure.
Figure 6:
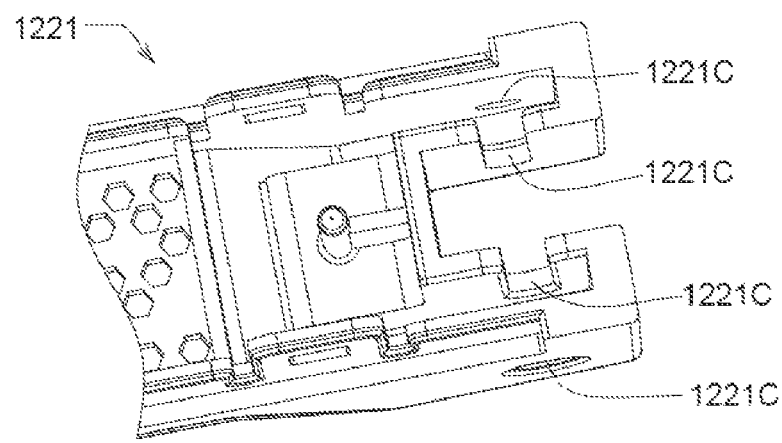
FIG. 6 is a structural schematic diagram of a part of the carrier for a storage device according to the first embodiment of the present disclosure.
Figure 13:
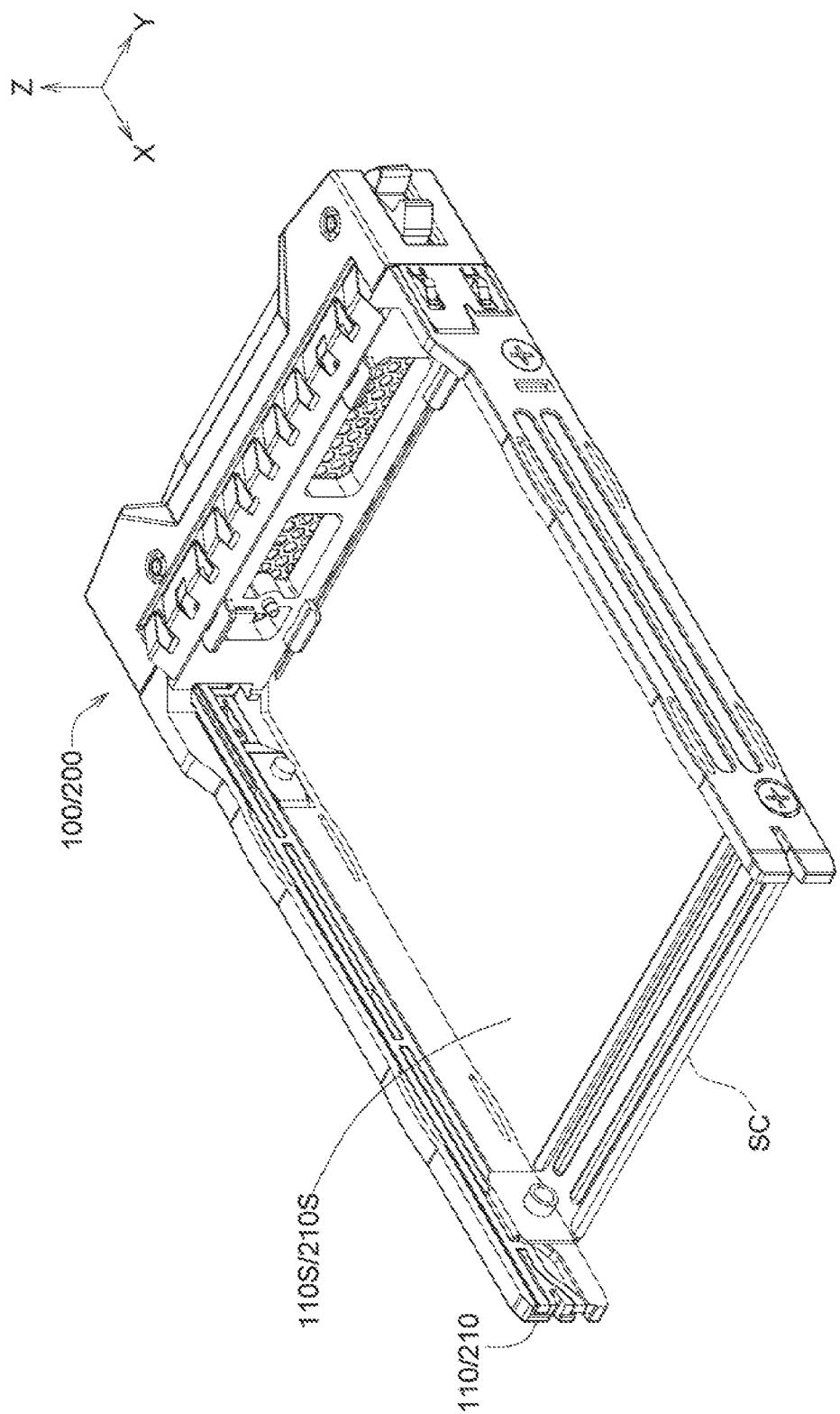
FIG. 13 is a schematic stereogram of a structural reinforcing component applicable to the carriers for a storage device according to the first embodiment and the second embodiment of the present disclosure.

The first embodiment of the present disclosure:

Please refer to FIG. 1 to FIG. 6 and FIG. 13 to FIG. 15. FIG. 1 shows an assembly schematic diagram of a carrier 100 for a storage device according to the first embodiment of the present disclosure. FIG. 2 shows an exploded schematic diagram of the carrier 100 for a storage device according to the first embodiment of the present disclosure. FIG. 3 shows a combination diagram of an accommodation bracket 110, an electromagnetic shielding element 130 and a light-guiding element 140 of the carrier 100 for a storage device according to the first embodiment of the present disclosure. FIG. 4 shows a front-view diagram of a panel 120 of the carrier 100 for a storage device according to the first embodiment of the present disclosure. FIG. 5 shows a partial top-view diagram of the carrier 100 for a storage device according to the first embodiment of the present disclosure. FIG. 6 shows a structural schematic diagram of a panel body 122 of the carrier 100 for a storage device according to the first embodiment of the present disclosure. FIG. 13 shows a schematic stereogram of a structural reinforcing component SC applicable to the carrier 100 for a storage device. FIG. 14A shows a schematic stereogram of a type of a latch of the carrier 100 for a storage device. FIG. 14B shows a top-view diagram of the type of the latch illustrated in FIG. 14A. FIG. 15A shows a schematic stereogram of another type of the latch of the carrier 100 for a storage device. FIG. 15B shows a top-view diagram of the type of the latch illustrated in FIG. 15A.

Please refer to FIG. 1 to FIG. 3, the first embodiment of the present disclosure provides the carrier 100 for a storage device, which is suitable for being installed in a current computer or server chassis (not shown) and is configured to accommodate and carry a current 2.5- or 3.5-inch storage device (not shown), such as a hard disk drive or a solid state drive. The carrier 100 includes an accommodation bracket 110, a panel 120 and an electromagnetic shielding element 130. The electromagnetic shielding element 130 is disposed between the accommodation bracket 110 and the panel 120. The accommodation bracket 110 has an open space 110S for accommodating a storage device in the accommodation bracket 110. The panel 120 has a handle 121 for the carrier 100 to be detachable from a chassis. The electromagnetic shielding element 130 is engaged with the accommodation bracket 110. That is, the electromagnetic shielding element 130 may be arranged to be directly inserted into the accommodation bracket 110 parallel to the X-axis direction in FIG. 2, and the electromagnetic shielding element 130 may be fixed to the accommodation bracket 110 by the snap-connection or clip-connection. As such, it is beneficial to the automated assembly process.

In addition, the electromagnetic shielding element 130 may further have a contact surface 130A for contacting with a storage device and a protruding elastic-piece structure 130S for providing a protection against the electromagnetic interference. Specifically, the electromagnetic shielding element 130 is formed by a grounded conductive material (such as metal) to facilitate the electrostatic discharge, grounding and so on, thereby effectively improving the protection against the electromagnetic interference.

Further, the carrier 100 may further comprise a light-guiding element 140, and the light-guiding element 140 may be used to provide a prompt function. For example, the light-guiding element 140 can provide a prompt about whether a storage device operates properly or not. The light-guiding element 140 may be engaged with a groove 110T of the accommodation bracket 110 at a side of the accommodation bracket 110 without using tools. That is, the light-guiding element 140 may be arranged to be directly inserted into the groove 110T of a corresponding size of the accommodation bracket 110 parallel to the X-axis direction in FIG. 2. As such, this is beneficial to the automated assembly process. Please refer to FIG. 2 and FIG. 3, the light-guiding element 140 protrudes from the surface of the accommodation bracket 110 that is adjacent to the electromagnetic shielding element 130, thereby extending into the panel 120 and providing a light signal with a prompt function on the front surface of the panel 120.

Please refer to FIG. 2 and FIG. 3, the mutual fixation of the accommodation bracket 110 and the electromagnetic shielding element 130 is described as follows. The electromagnetic shielding element 130 further comprises a body portion 131 and an extension portion 132. The accommodation bracket 110 comprises a receiving portion 111. For example, the body portion 131 and the extension portion 132 of the electromagnetic shielding element 130 may be integrally formed. The body portion 131 has a first surface S1 facing the accommodation bracket 110 and an opposite second surface S2. The extension portion 132 protrudes from the first surface S1 in a direction toward the accommodation bracket 110, namely parallel to the X-axis direction in FIG. 2.

In addition, the aforementioned elastic-piece structure 130S for providing protection against the electromagnetic interference may be disposed on the body portion 131, and the extension portion 132 may include the aforementioned contact surface 130A which is used for contacting with a storage device. The receiving portion 111 is an open notch formed on both sides of the accommodation bracket 110, and the extension portion 132 is a protruding component extending toward the accommodation bracket 110. The receiving portion 111 and the extension portion 132 are male-female connection structures. The electromagnetic shielding element 130 is fixed to the accommodation bracket 110 through that the extension portion 132 is fastened to the receiving portion 111.

Specifically, please refer to FIG. 2, the receiving portion 111 is sequentially provided with an inclined plane 111I and an opening 111T along the direction in which the extension portion 132 enters the receiving portion 111, namely parallel to the X-axis direction in FIG. 2. Also, the extension portion 132 has an engagement end 132C. Please also refer to FIG. 3, the engagement end 132C is, for example, a buckle end that could be guided by the inclined plane 111I and then enters the opening 111T to be fastened to the receiving portion 110. That is, the engagement end 132C can deform toward the open space 110S when it abuts against the inclined plane 111I due to its elasticity. Besides, the engagement end 132C is reshaped in the opening 111T after passing through the inclined plane 111I. As such, the engagement end 132C is fastened to the accommodation bracket 110. The mutual fixation of the accommodation bracket 110 and the electromagnetic shielding element 130 is achieved through the guidance of an inclined plane, and it is beneficial to the automated assembly process. Further, the electromagnetic shielding element 130 can provide a protection against the electromagnetic interference trough that the extension portion 132 is provided with the contact surface 130A which is used for contacting with the storage device in the open space 110S.

Furthermore, the extension portion 132 may be provided with a first through hole 132H, and the receiving portion 111 may be provided with a second through hole 111H. The first through hole 132H and the second through hole 111H are aligned in a direction parallel to the first surface S1 or the second surface S2, namely parallel to the Y-axis direction in FIG. 2. A storage device may be fixed in the carrier 100 through the first through hole 132H and the second through hole 111H. For example, a locking means is used to pass through these two through holes to achieve the fixation. Therefore, a contact for protection against the electromagnetic interference can be provided for the storage device, and the storage device can be fixed in the accommodation bracket 110 as well.

Please refer to FIG. 2 and FIG. 4, the panel 120 may comprises the handle 121 and a panel body 122, the handle 121 has a movable portion 121A and a pivot portion 121F, and the panel body 122 includes a body 1221, a switch 1222 and a latch 1223. The latch 1223 may be assembled parallel to the X-axis direction in FIG. 2 to contact with the switch 1222 and may be disposed in the body 1221, as shown in FIG. 4. The latch 1223 can be pivotally connected to the panel body 122 through a positioning member P1 passing through the latch 1223 and the body 1221. The latch 1223 can rotate around the positioning member P1 along the direction D2 to release the movable portion 121A.

Please refer to FIG. 2, FIG. 4 and FIG. 5, the movable portion 121A is detachably connected to the latch 1223, and the pivot portion 121F is pivotally connected to the panel body 122 through a positioning member P2 passing through the pivot portion 121F and the body 1221. A hook portion 1223C of the latch 1223 may engage with a corresponding hook portion 121AC of the movable portion 121A so as to fix the handle 121 in the body 1221. An external force from a user is allowed to press on the switch 1222 to drive the latch 1223 to release the movable portion 121A. That is, the engagement between the hook portion 1223C of the latch 1223 and the hook portion 121AC of the movable portion 121A can be unlocked, such that the movable portion 121A can rotate around the positioning member P2 relative to the body 1221 through the pivot portion 121F. At the same time, the fixation between a hook portion 121FC of the pivot portion 121F and a corresponding hook structure of the chassis can be unlocked. The handle 121 can rotate along the direction D1 away from the panel 120, such that the carrier 100 can be disassembled from the chassis, namely extracted from the chassis.

Further, the carrier 100 may further comprise an elastic element 150 to make the switch 122 reciprocate, thereby switching the handle 121 between the fixing state and the releasing state. Further, the latch 1223 further includes a protruding portion 1223P extending and protruding parallel to the reciprocating direction of the elastic element 150, namely parallel to the X-axis direction in FIG. 2, as shown in FIG. 2. When the carrier 100 is assembled, the protruding portion 1223P can penetrate into the elastic element 150 to fix and limit the elastic element 150 without other complicated fixing means. Therefore, it is beneficial to the automated assembly process. In addition, please refer to FIG. 2, the body 1221 may be provided with one or more buckle portion(s) 1221C in a direction facing the accommodation bracket 110, and the accommodation bracket 110 is provided with one or more corresponding buckle portion(s) 110C able to be engaged with the buckle portion(s) 1221C. The panel 120 is fastened to the accommodation bracket in a tool-less manner through the engagement between the buckle portion(s) 1221C and the corresponding buckle portion(s) 110C without other complicated fixing means. As such, it is beneficial to the automated assembly process.

Please refer to FIG. 6, a portion of the body 1221 pivotally connected to the pivoting portion 121F (not shown) has a plurality of channels 1221C spaced apart and aligned with each other for the positioning member P2 (not shown) to pass through. As shown in FIG. 6, these channels 1221C may be closed through holes or open notches, as long as the positioning members P2 can be positioned and pass through. In addition, at least one of the channels 1221C has a chamfer structure and/or a rib structure; such structures are beneficial for the positioning member P2 to smoothly insert into the body 1221.

Please refer to FIG. 13, a structural reinforcing component SC is applicable to the carrier 100 to reinforce the fixation of the overall structure. The structural reinforcing component SC may be disposed in the open space 110S, and its two ends are connected and fixed to the accommodation bracket 110 (, or the structural reinforcing component SC and the accommodation bracket 110 are integrally formed). With the application of the structural reinforcing component SC, the width of the accommodation bracket 110 of the carrier 100 along the Y-axis direction in FIG. 13 can be maintained, so as to ensure a feasible width when a storage device is accommodated into the accommodation bracket 110, and also to strengthen the structural stiffness of the carrier 100.

Figure 14A:
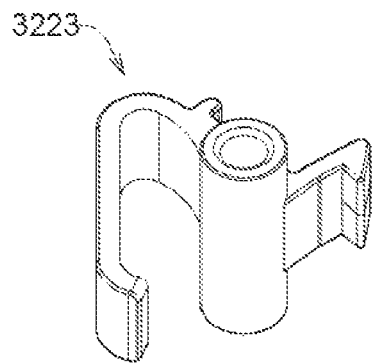
FIG. 14A is a schematic stereogram of a type of a latch of the carriers for a storage device according to the first embodiment and the second embodiment of the present disclosure.
Figure 14B:
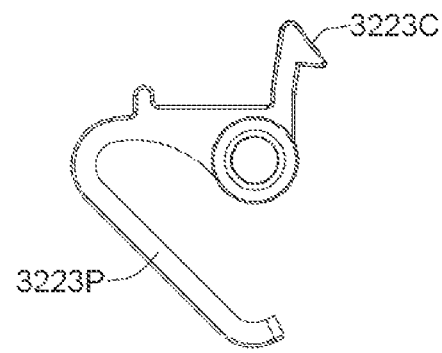
FIG. 14B is a top-view diagram of the type of the latch illustrated in FIG. 14A.

Please refer to FIG. 14A and FIG. 14B, in addition to the above implementation of the latch 1223, another type of a latch is also applicable to the carrier 100. That is, a latch 3223 may replace the latch 1223 and the elastic element 150 described above. Specifically, the latch 3223 includes a protruding portion 3223P and a hook portion 3223C that are integrally formed. The hook portion 3223C of the latch 3223 is able to engage with the corresponding hook portion 121AC of the movable portion 121A, so as to fix the handle 121 in the body 1221. As shown in FIG. 14A and FIG. 14B, the protruding portion 3223P is a bent elastic arm, and the protruding portion 3223P can provide the function equivalent to that of the elastic element 150 to make the switch 122 reciprocate. Therefore, the latch 1223 and the elastic element 150 can be replaced by a single integrally formed latch 3223, thereby saving the number of components used and even reducing the burden of the automated assembly process.

Figure 15A:
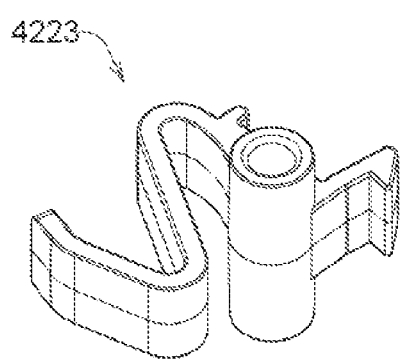
FIG. 15A is a schematic stereogram of another type of the latch of the carriers for a storage device according to the first embodiment and the second embodiment of the present disclosure.
Figure 15B:
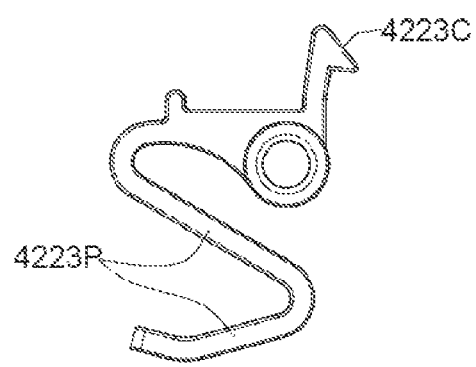
FIG. 15B is a top-view diagram of the type of the latch illustrated in FIG. 15A.

Please refer to FIG. 15A and FIG. 15B, another type of latch is also applicable to the carrier 100. That is, a latch 4223 may replace the latch 1223 and the elastic element 150. Specifically, the latch 4223 includes a protruding portion 4223P and a hook portion 4223C that are integrally formed. A hook portion 4223C of the latch 4223 is able to engage with the corresponding hook portion 121AC of the movable portion 121A, so as to fix the handle 121 in the body 1221. As shown in FIG. 15A and FIG. 15B, the protruding portion 4223P is a bent two-section elastic arm, and the protruding portion 4223P can provide the function equivalent to that of the elastic element 150 to make the switch 122 reciprocate. Therefore, the latch 1223 and the elastic element 150 can be replaced by a single integrally formed latch 4223, thereby saving the number of components used and even reducing the burden of the automated assembly process.

Figure 7:
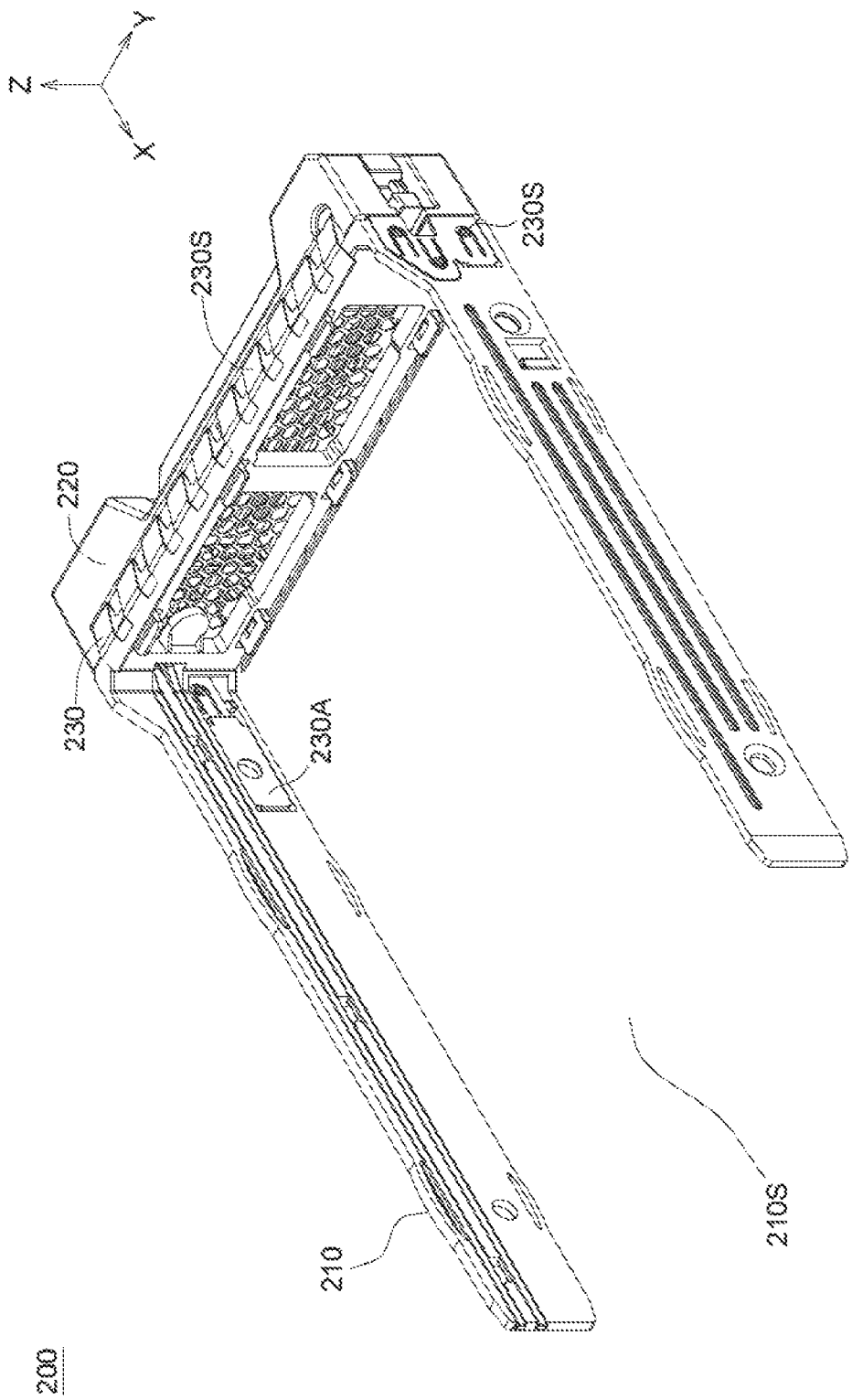
FIG. 7 is an assembly schematic diagram of a carrier for a storage device according to the second embodiment of the present disclosure.
Figure 8:
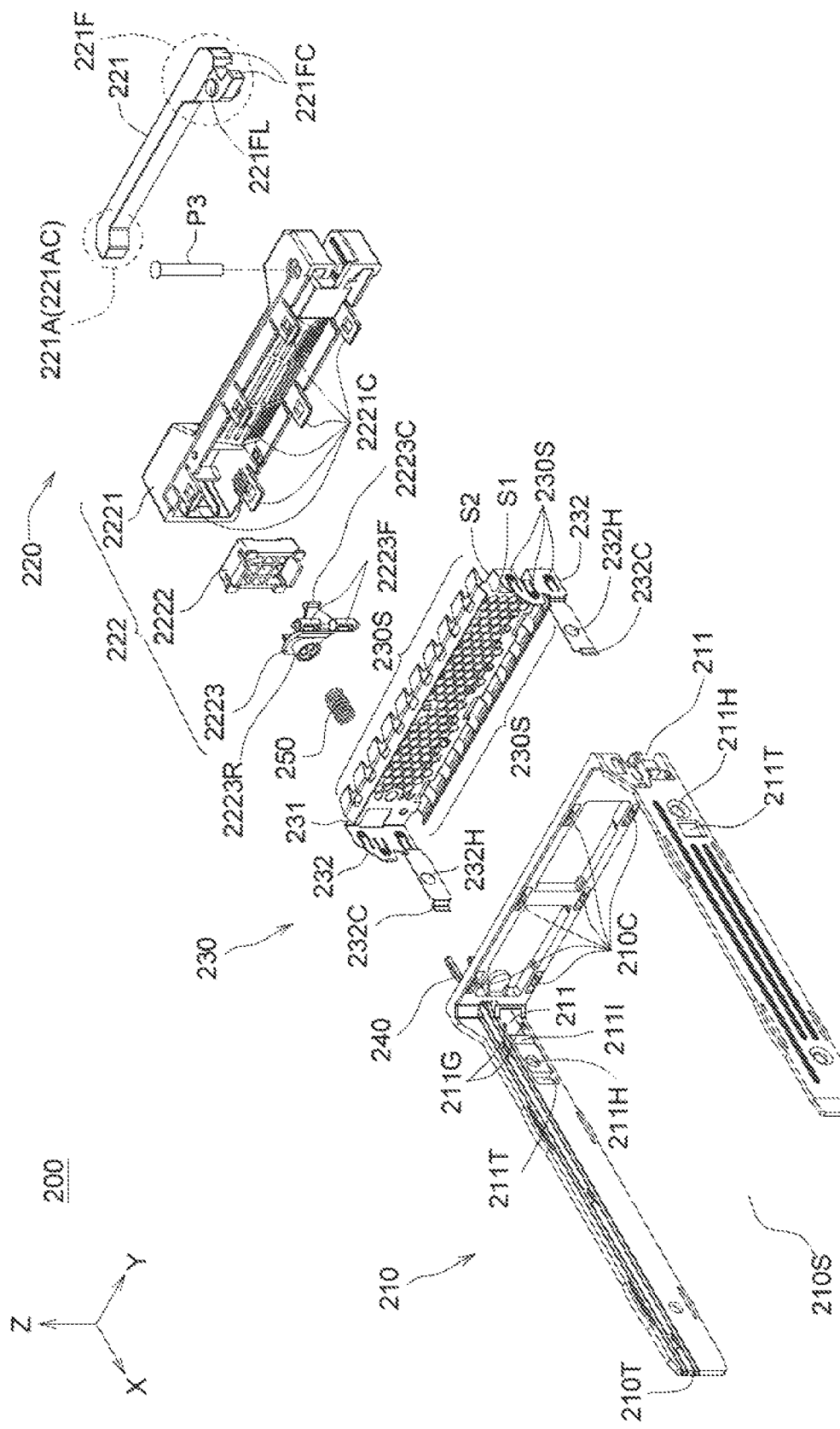
FIG. 8 is an exploded schematic diagram of the carrier for a storage device according to the second embodiment of the present disclosure.
Figure 9:
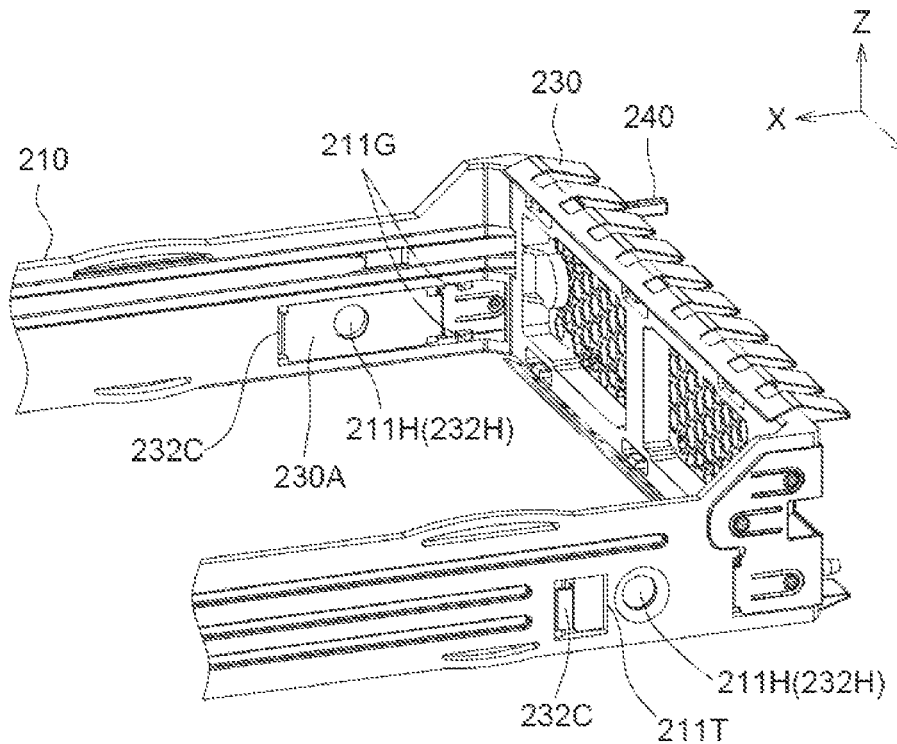
FIG. 9 is a combination diagram of some parts of the carrier for a storage device according to the second embodiment of the present disclosure.
Figure 10:
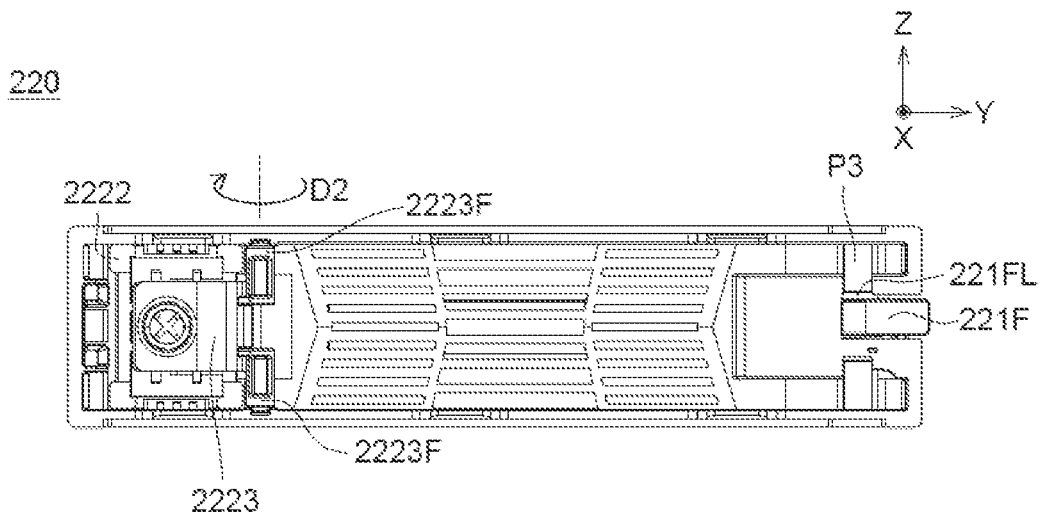
FIG. 10 is a front-view diagram of a part of the carrier for a storage device according to the second embodiment of the present disclosure.
Figure 11:
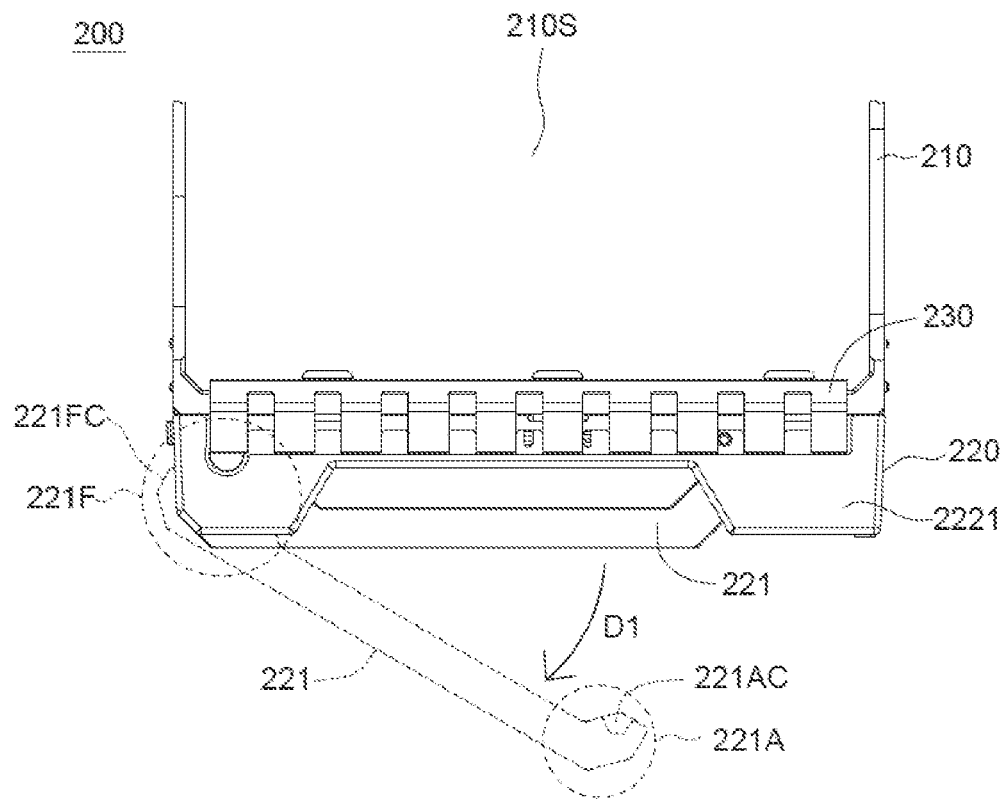
FIG. 11 is a partial top-view diagram of the carrier for a storage device according to the second embodiment of the present disclosure.
Figure 12:
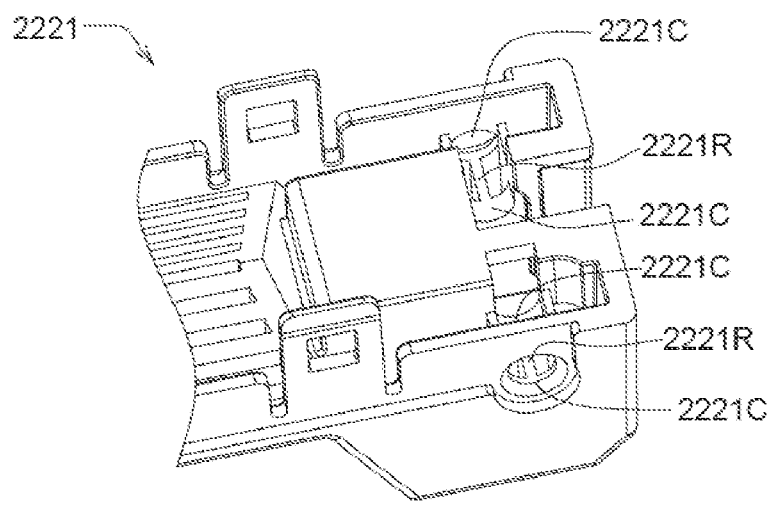
FIG. 12 is a structural schematic diagram of a part of the carrier for a storage device according to the second embodiment of the present disclosure.

The second embodiment of the present disclosure:

Please refer to FIG. 7 to FIG. 13. FIG. 7 shows an assembly schematic diagram of a carrier 200 for a storage device according to the second embodiment of the present disclosure. FIG. 8 shows an exploded schematic diagram of the carrier 200 for a storage device according to the second embodiment of the present disclosure. FIG. 9 shows a combination diagram of an accommodation bracket 210, an electromagnetic shielding element 230 and a light-guiding element 240 of the carrier 200 for a storage device according to the second embodiment of the present disclosure. FIG. 10 shows a front-view diagram of a panel 220 of the carrier 200 for a storage device according to the second embodiment of the present disclosure. FIG. 11 shows a partial top-view diagram of the carrier 200 for a storage device according to the second embodiment of the present disclosure. FIG. 12 shows a structural schematic diagram of a panel body 222 of the carrier 200 for a storage device according to the second embodiment of the present disclosure. FIG. 13 shows a schematic stereogram of the structural reinforcing component SC applicable to the carrier 200 for a storage device.

Please refer to FIG. 7 to FIG. 9, the second embodiment of the present disclosure provides the carrier 200 for a storage device, which is suitable for being installed in a current computer or server chassis (not shown) and is configured to accommodate and carry a current 3.5-inch storage device (not shown). The carrier 200 includes an accommodation bracket 210, a panel 220 and an electromagnetic shielding element 230. The electromagnetic shielding element 230 is disposed between the accommodation bracket 210 and the panel 220. The accommodation bracket 210 has an open space 210S for accommodating a storage device in the accommodation bracket 210. The panel 220 has a handle 221 for the carrier 200 to be detachable from a chassis. The electromagnetic shielding element 230 is engaged with the accommodation bracket 210. That is, the electromagnetic shielding element 230 may be arranged to be directly inserted into the accommodation bracket 210 parallel to the X-axis direction in FIG. 8, and the electromagnetic shielding element 230 may be fixed to the accommodation bracket 210 by the snap-connection or clip-connection. As such, it is beneficial to the automated assembly process.

In addition, the electromagnetic shielding element 230 may further have a contact surface 230A for contacting with a storage device and a protruding elastic-piece structure 230S for providing a protection against the electromagnetic interference. Specifically, the electromagnetic shielding element 230 is formed by a grounded conductive material (such as metal) to facilitate the electrostatic discharge, grounding and so on, thereby effectively improving the protection against the electromagnetic interference.

Further, the carrier 200 may further comprise a light-guiding element 240, and the light-guiding element 240 may be used to provide a prompt function. For example, the light-guiding element 240 can provide a prompt about whether a storage device operates properly or not. The light-guiding element 240 may be engaged with a groove 210T of the accommodation bracket 210 at a side of the accommodation bracket 210 without using tools. That is, the light-guiding element 240 may be arranged to be directly inserted into the groove 210T of a corresponding size of the accommodation bracket 210 parallel to the X-axis direction in FIG. 8. As such, this is beneficial to the automated assembly process. Please refer to FIG. 8 and FIG. 11, the light-guiding element 240 protrudes from the surface of the accommodation bracket 210 that is adjacent to the electromagnetic shielding element 230, thereby extending into the panel 220 and providing a light signal with a prompt function on the front surface of the panel 220.

Please refer to FIG. 8 and FIG. 9, the mutual fixation of the accommodation bracket 210 and the electromagnetic shielding element 230 is described as follows. The electromagnetic shielding element 230 further comprises a body portion 231 and an extension portion 232. The accommodation bracket 210 comprises a receiving portion 211. For example, the body portion 231 and the extension portion 232 of the electromagnetic shielding element 230 may be integrally formed. The body portion 231 has a first surface S1 facing the accommodation bracket 210 and an opposite second surface S2. The extension portion 232 protrudes from the first surface S1 in a direction toward the accommodation bracket 210, namely parallel to the X-axis direction in FIG. 8.

In addition, the aforementioned elastic-piece structure 230S for providing protection against the electromagnetic interference may be disposed on the body portion 231, and the extension portion 232 may include the aforementioned contact surface 230A which is used for contacting with a storage device. The receiving portion 211 is an open notch formed on both sides of the accommodation bracket 210, and the extension portion 232 is a protruding component extending toward the accommodation bracket 210. The receiving portion 211 and the extension portion 232 are male-female connection structures. The electromagnetic shielding element 230 is fixed to the accommodation bracket 210 through that the extension portion 232 is fastened to the receiving portion 211.

Specifically, please refer to FIG. 8, the receiving portion 211 is sequentially provided with a guiding member 211, an inclined plane 211I and an opening 211T along the direction in which the extension portion 232 enters the receiving portion 211, namely parallel to the X-axis direction in FIG. 8. Also, the extension portion 132 has an engagement end 232C. Please refer to FIG. 8 and FIG. 9, the engagement end 232C is firstly guided by a slope of the guiding member 211, and then the engagement end 232C is guided by the inclined plane 211I and enters the opening 211T to be fastened to the receiving portion 210. That is, the engagement end 232C can deform toward the open space 210S when it abuts against the guiding member 211 and the inclined plane 211I due to its elasticity. Besides, the engagement end 232C is reshaped in the opening 211T after passing through the guiding member 211 and the inclined plane 211I. As such, the engagement end 232C is fastened to the accommodation bracket 210. The mutual fixation of the accommodation bracket 210 and the electromagnetic shielding element 230 is achieved through the guidance of an inclined plane, and it is beneficial to the automated assembly process. Further, the electromagnetic shielding element 230 can provide a protection against the electromagnetic interference trough that the extension portion 232 is provided with the contact surface 230A which is used for contacting with the storage device in the open space 210S.

Furthermore, the extension portion 232 may be provided with a first through hole 232H, and the receiving portion 211 may be provided with a second through hole 211H. The first through hole 232H and the second through hole 211H are aligned in a direction parallel to the first surface S1 or the second surface S2, namely parallel to the Y-axis direction in FIG. 8. A storage device may be fixed in the carrier 200 through the first through hole 232H and the second through hole 211H. For example, a locking means is used to pass through these two through holes to achieve the fixation. Therefore, a contact for protection against the electromagnetic interference can be provided for the storage device, and the storage device can be fixed in the accommodation bracket 210 as well.

Please refer to FIG. 8 and FIG. 10, the panel 220 may comprises the handle 221 and a panel body 222, the handle 221 has a movable portion 221A and a pivot portion 221F, and the panel body 222 includes a body 2221, a switch 2222 and a latch 2223. The latch 2223 may be assembled parallel to the X-axis direction in FIG. 8 to contact with the switch 2222 and may be disposed in the body 2221, as shown in FIG. 10.

The difference between the design of this second embodiment and that of the carrier 100 of the first embodiment is that the latch 2223 of the carrier 200 has at least two separated abutting structures 2223F. That is, these two abutting structures 2223F are not a single columnar structure. Therefore, the use of positioning members can be omitted. The at least two abutting structures 2223F may be fixed inside the grooves without using tools along the direction parallel to the electromagnetic shielding element 230 toward the panel 220, namely parallel to the X-axis direction in FIG. 8. As such, it is beneficial to the automated assembly process. Further, the design of coaxial separation provides the elasticity of the latch 2223, thereby making the latch 2223 smoothly installed in the body 2221 during the automated assembly. Specifically, the at least two abutting structures 2223F respectively abuts against a top surface and a bottom surface of an inner wall of the body 2221. The top surface and the bottom surface of the body 2221 can be correspondingly provided with a chamfer to guide the abutting structures 2223F to be smoothly assembled therein. The at least two abutting structures form as an axis for the latching member 2223 to rotate along the direction D2 to release the movable portion 221A.

Please refer to FIG. 8, FIG. 10 and FIG. 11, the movable portion 221A is detachably connected to the latch 2223, and the pivot portion 221F is pivotally connected to the panel body 222 through a positioning member P3 passing through the pivot portion 221F and the body 2221. A hook portion 2223C of the latch 2223 may engage with a corresponding hook portion 221AC of the movable portion 221A so as to fix the handle 221 in the body 2221. An external force from a user is allowed to press on the switch 2222 to drive the latch 2223 to release the movable portion 221A. That is, the engagement between the hook portion 2223C of the latch 2223 and the hook portion 221AC of the movable portion 221A can be unlocked, such that the movable portion 221A can rotate around the positioning member P3 relative to the body 2221 through the pivot portion 221F. At the same time, the fixation between a hook portion 221FC of the pivot portion 221F and a corresponding hook structure of the chassis can be unlocked. The handle 221 can rotate along the direction D1 away from the panel 220, such that the carrier 200 can be disassembled from the chassis, namely extracted from the chassis.

Further, the carrier 200 may further comprise an elastic element 250 to make the switch 222 reciprocate, thereby switching the handle 221 between the fixing state and the releasing state. Further, the latch 2223 further includes a recess 223R recessed inward parallel to the reciprocating direction of the elastic element 250 to provide an accommodation space for the elastic element 250, as shown in FIG. 8. When the carrier 200 is assembled, one end of the elastic element 250 can abut against the electromagnetic shielding element 230 and the other end of the elastic element 250 can be positioned in the recess 2223R of the latch 2223 without other complicated fixing means. Therefore, it is beneficial to the automated assembly process. In addition, please refer to FIG. 8, the body 2221 may be provided with one or more buckle portion(s) 2221C in a direction facing the accommodation bracket 210, and the accommodation bracket 210 is provided with one or more corresponding buckle portion(s) 210C able to be engaged with the buckle portion(s) 2221C. The panel 220 is fastened to the accommodation bracket in a tool-less manner through the engagement between the buckle portion(s) 2221C and the corresponding buckle portion(s) 210C without other complicated fixing means. As such, it is beneficial to the automated assembly process.

Please refer to FIG. 12, a portion of the body 2221 pivotally connected to the pivoting portion 221F (not shown) has a plurality of channels 2221C spaced apart and aligned with each other for the positioning member P3 (not shown) to pass through. As shown in FIG. 12, these channels 2221C may be closed through holes or open notches, as long as the positioning members P3 can be positioned and pass through. In addition, at least one of the channels 2221C has a chamfer structure and/or a rib structure; such structures are beneficial for the positioning member P3 to smoothly insert into the body 2221. In addition, the body 2221 may further include a rib-shaped structure 2221R connected between the channels 2221C to serve as a guiding structure when the positioning member P3 is installed, so as to improve the convenience of automated assembly process. Moreover, as shown in FIG. 8 and FIG. 10, the pivot portion 221F further includes a positioning hole 221FL protruding from an upper surface of the handle 221 to provide a limiting position for the handle 221 during assembling. The positioning hole 221FL may also have a chamfered angle, such that the positioning member P3 can more easily penetrate into one of the channels 2221C and the positioning hole 221FL.

Please refer to FIG. 13, the same structural reinforcing component SC in the first embodiment is also applicable to the carrier 200 to reinforce the fixation of the overall structure. The structural reinforcing component SC may be disposed in the open space 210S, and its two ends are connected and fixed to the accommodation bracket 210 (, or the structural reinforcing component SC and the accommodation bracket 210 are integrally formed). With the application of the structural reinforcing component SC, the width of the accommodation bracket 210 of the carrier 200 along the Y-axis direction in FIG. 13 can be maintained, so as to ensure a feasible width when a storage device is accommodated into the accommodation bracket 210, and also to strengthen the structural stiffness of the carrier 200.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A carrier for a storage device, comprising:
   an accommodation bracket having an open space and comprising a receiving portion, wherein the receiving portion is provided with a notch connecting an outer side and an inner side of the accommodation bracket in a first direction;
   a panel having a handle; and
   an electromagnetic shielding element disposed between the accommodation bracket and the panel, wherein the electromagnetic shielding element comprises an extension portion inserting into the notch and extending along an inner sidewall of the accommodation bracket in a second direction to abut against the receiving portion, and the accommodation bracket has different thickness at a position corresponding to the extension portion.

2. The carrier for the storage device according to claim 1, wherein the electromagnetic shielding element comprises:
   a body portion having a first surface facing the accommodation bracket and an opposite second surface; and
   wherein the extension portion protrudes from the first surface in a direction toward the accommodation bracket.

3. The carrier for the storage device according to claim 2, wherein the receiving portion has an inclined plane and an opening on the inner sidewall, the extension portion has an engagement end, and the engagement end is engaged with the opening through the inclined plane.

4. The carrier for the storage device according to claim 1, further comprising a light-guiding element, wherein the light-guiding element is engaged with a groove of the accommodation bracket at a side of the accommodation bracket.

5. The carrier for the storage device according to claim 1, wherein the accommodation bracket comprises:
- a first bracket part provided with a first end and a second end;
- a second bracket part disposed substantially parallel to the first bracket part and provided with a third end and a fourth end; and
- a third bracket part provided with two ends respectively connected to the second end of the first bracket part and the third end of the second bracket part.

6. The carrier for the storage device according to claim 5, further comprising a structural reinforcing component connected between the first bracket part and the second bracket part.

7. The carrier for the storage device according to claim 6, wherein the structural reinforcing component is separated from the first end or the fourth end.

8. The carrier for the storage device according to claim 1, wherein the panel comprises:
- a panel body comprising a body, a switch and a latch, wherein the latch in contact with the switch is disposed in the body; and
- the handle comprising a movable portion and a pivot portion, wherein the movable portion is detachably connected to the latch, and the pivot portion is pivotally connected to the body;
- wherein the switch is adapted to be pressed by an external force to drive the latch to release the movable portion.

9. The carrier for the storage device according to claim 8, wherein the latch is connected to the body through a positioning member, and the latch rotates around the positioning member to release the movable portion.

10. The carrier for the storage device according to claim 8, wherein the latch has at least two separated abutting structures respectively abutting against a top surface and a bottom surface of an inner wall of the body, and the at least two abutting structures form as an axis for the latch to rotate therearound to release the movable portion.

11. The carrier for the storage device according to claim 8, further comprising an elastic element, wherein one end of the elastic element abuts against the electromagnetic shielding element, and another end of the elastic element abuts against the latch.

12. The carrier for the storage device according to claim 8, wherein a portion of the body pivotally connected to the pivot portion has a plurality of channels spaced apart and aligned with each other, and at least one of the channels has a chamfer structure or a rib structure.

13. The carrier for the storage device according to claim 8, wherein the body has an engagement portion in the direction toward the accommodation bracket, and the body is engaged with a corresponding engagement part of the accommodation bracket through the engagement portion.

14. A carrier for a storage device, comprising:
- an accommodation bracket having an open space and comprising a receiving portion;
- a panel having a handle; and
- an electromagnetic shielding element disposed between the accommodation bracket and the panel, wherein the electromagnetic shielding element comprises an extension portion, the extension portion is provided with a first through hole, the receiving portion is provided with a second through hole, and the first through hole and the second through hole are aligned with each other.

15. The carrier for the storage device according to claim 14, wherein the receiving portion is provided with a notch, and the extension portion inserting into the notch extends along an inner sidewall of the accommodation bracket.

16. The carrier for the storage device according to claim 14, wherein the extension portion comprises an engagement end engaged to the receiving portion from an inner sidewall of the accommodation bracket.

* * * * *